United States Patent [19]
Bays et al.

[11] Patent Number: 5,648,777
[45] Date of Patent: Jul. 15, 1997

[54] DATA CONVERTER WITH FIFO

[75] Inventors: Laurence Edward Bays, Allentown; Richard Muscavage, Gilbertsville; Steven Robert Norsworthy, Emmaus, all of Pa.

[73] Assignee: Lucent Technologies Inc., Murray Hill, N.J.

[21] Appl. No.: 168,447

[22] Filed: Dec. 16, 1993

[51] Int. Cl.$^6$ .................................................. H03M 1/20
[52] U.S. Cl. ..................... 341/110; 364/724.1; 341/123
[58] Field of Search ............................. 341/110, 123, 341/155, 143; 395/250, 445; 364/239.6, 939.4, 724.1

[56] References Cited

U.S. PATENT DOCUMENTS

| | | | |
|---|---|---|---|
| 4,020,332 | 4/1977 | Crochiere et al. | 341/61 |
| 4,550,425 | 10/1985 | Andersen | 381/30 |
| 4,825,448 | 4/1989 | Critchlow et al. | 375/8 |
| 4,833,655 | 5/1989 | Wolf et al. | 365/221 |
| 5,051,981 | 9/1991 | Kline | 370/32.1 |
| 5,144,308 | 9/1992 | Norsworthy | 341/131 |
| 5,255,238 | 10/1993 | Ichige . | |

OTHER PUBLICATIONS

An Audio Engineering Society Preprint Presented at the 95th Convention 1993, Oct. 7–10, New York, "A Single Chip Stereo Audio Codec for PC Multimedia Applications", by Scott McDonald, et al., Crystal Semiconductor Corporation, Austin, TX pp. 1–13.

Oversampling Delta–Sigma Data Converters, Theory, Design and Simulation, edited by James C. Candy and Gabor C. Temes, IEEE Press, A Selected Reprint Volume published in 1992, "Oversampling Methods for A/D and D/A Conversion", pp. 1–29.

Motorola DSP56166 "Digital Signal Processor User's Manual", pp. 6-2-6-29.

EDN Electrical Design News, 9 Aug., 1984, Newton, Massachusetts US, pp. 274–278, Freeman "FIFO Eases ADC-–to-UART Interface", the whole document.

IEEE Journal of Solid–State Circuits, vol. 26, No. 12, Dec. 1991, New York, pp. 1920–1926; XP272852, Lerch et al "A Monolithic Sigma–Delta A/D and D/A Converter." p. 1921, column 2, line 14–16; FIGS. 2,3.

Patent Abstracts of Japan vol. 16, No. 412 (E–1256) 31 Aug. 1992 & JP-A-04 137 907 (Yokogawa).

*Primary Examiner*—Jeffrey A. Gaffin
*Assistant Examiner*—Peguy Jean Pierre
*Attorney, Agent, or Firm*—David L. Smith

[57] ABSTRACT

A data converter for converting a signal either from analog form to digital form or from digital form to analog form includes a storage register. The storage register receives and temporarily stores digital data samples. The digital data samples are transferable out of the storage register in the same sequence in which they were received. A digital signal processor coupled to the storage register is interruptible to transferred digital data samples either to or from the storage register. In this manner, the digital signal processor transfers multiple digital data samples either to or from the storage register during each interrupt rather than transferring a single data sample per interrupt, thereby reducing the number of interrupts necessary to transfer a given number of digital data samples.

27 Claims, 2 Drawing Sheets

DATA CONVERTER WITH FIFO

TECHNICAL FIELD

This application relates generally to data converters such as encoders or decoders for converting signals from analog form to digital form, or conversely from digital form to analog form, and particularly to such converters which include a digital signal processor (DSP) in which operation of the DSP is interrupted to service the needs of the converter.

BACKGROUND OF THE INVENTION

Data converters are used in many applications such as telephone switching equipment, voice band data communications, speech coding systems, and audio and video signal processing equipment. Oversampled analog-to-digital (A/D) converter, includes one or more stages of decimation which lowers the sampling rate of periodic digital samples from the higher rate of an oversampling A/D converter. Each time the oversampling A/D converter generates a digital sample, a DSP is interrupted to acquire the digital sample and write the sample to DSP memory. Alternatively, the digital sample could be acquired by the DSP by polling the status of the DSP input data register coupled to the A/D output data register. When a sufficient number of samples has been acquired by the DSP, the DSP can branch to a routine to filter and decimate the samples to result in a single decimated sample. An oversampled digital-to-analog (D/A) converter includes one or more stages of interpolation which raises the sampling rate of periodic input digital samples to the higher rate of the D/A converter. Each time the oversampled D/A converter requests a digital input word, a DSP is interrupted to write a digital sample to one of its output registers which provides input to the over-sampled D/A converter. Alternatively, the digital sample could be provided by the DSP by polling the status of the DSP output data register coupled to the D/A input data register.

Data converters are only two of many sources from which a DSP in one of the above applications can receive interrupts. Each time the DSP receives an interrupt, the DSP goes into an interrupt service routine. There is overhead associated with each interrupt, The DSP must cease executing the set of instructions it was executing at the time the interrupt occurred, execute interrupt service routine instructions to save addresses of RAM and ROM pointers, and know the addresses of available portions of memory to use to temporarily store data so that subsequent to servicing the interrupt, the DSP can reconstruct its pre-interrupt status and resume executing the set of instructions it was executing at the time time interrupt occurred. Each interrupt of the DSP thus has an associated cost in terms of instruction execution, measured in millions of instructions per second (MIPS). Each interrupt translates into fewer MIPS available for useful application of the DSP. The cost can also be translated into consumption of power and lost computing time.

It would be desirable to have a data converter that interrupts its associated DSP fewer times in processing the same quantity of data. Reducing the number of times the DSP is interrupted increases the available MIPS for calculation and further, conserves power by eliminating needless execution of the interrupt service routine instructions.

SUMMARY OF THE INVENTION

In accordance with an embodiment of the invention, a data converter for converting a signal either from analog form to digital form or from digital form to analog form includes a storage register. The storage register receives and temporarily stores digital data samples. The digital data samples are transferable out of the storage register in the same sequence in which they were received. A digital processor coupled to the storage register is interruptible to transfer digital data samples either to or from the storage register. In this manner, the digital processor transfers multiple digital data samples either to or from the storage register during each interrupt rather than transferring a single data sample per interrupt, thereby reducing the number of interrupts necessary to transfer a given number of digital data samples.

DETAILED DESCRIPTION

Figure 1:
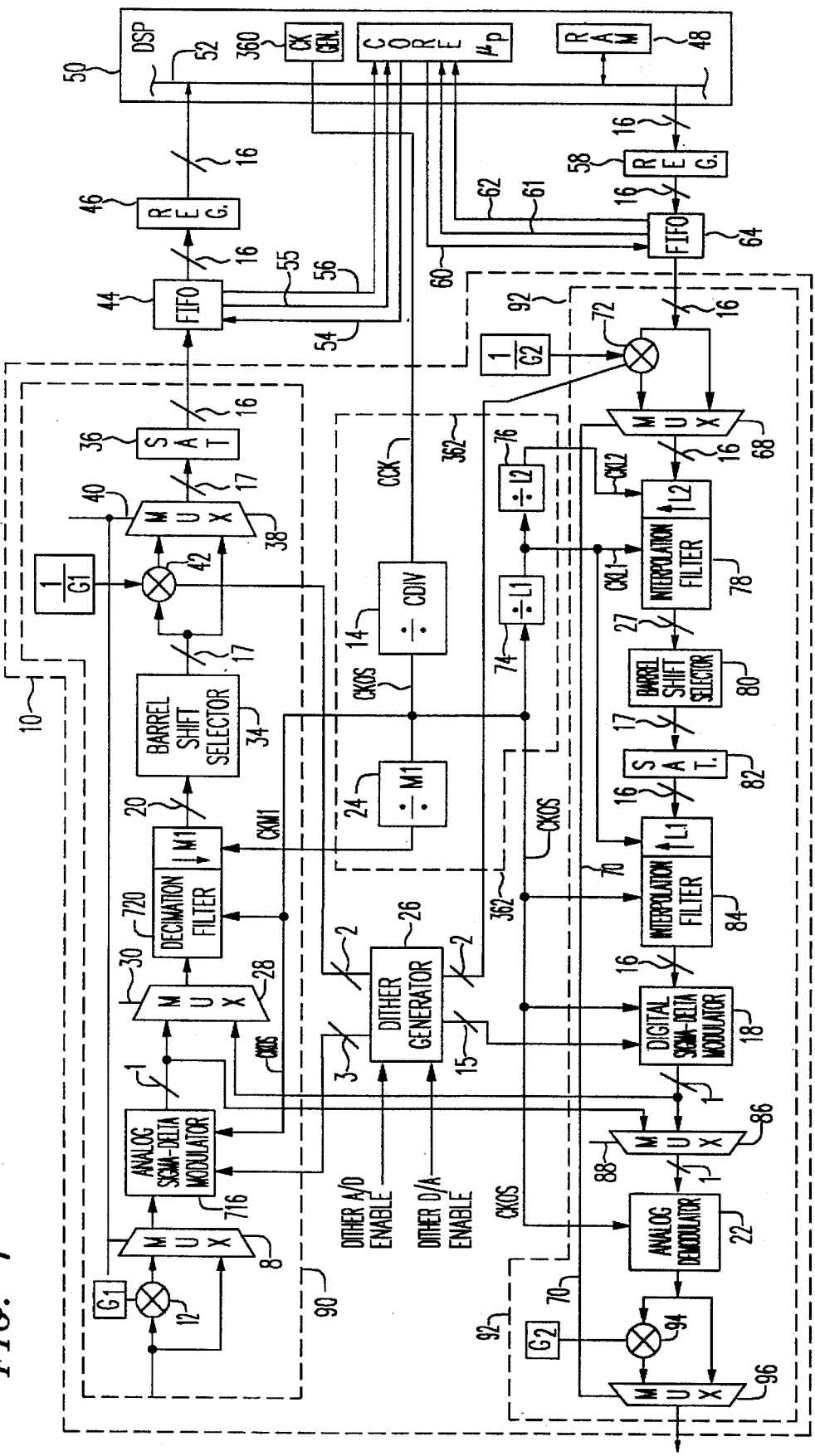
FIG. 1 is a block diagram of a data converter in accordance with an embodiment the present invention.

An illustrative data converter 10 including gain dither and rounding is shown in FIG. 1. Data converter 10 is shown as having an analog-to-digital (A/D) conversion signal path including coder 90, which is an A/D type data converter. The A/D conversion path includes an analog sigma-delta modulator 716, decimation filter 720, barrel shift selector 34 and saturation circuit 36. The digital-to-analog (D/A) conversion signal path includes decoder 92 which is a D/A type data converter. The digital-to-analog conversion path includes interpolation filter 78, barrel shift selector 80, saturation circuit 82, interpolation filter 84, digital sigma-delta modulator 18 and analog demodulator 22.

Data converter 10 is clocked by incoming clock signal CCK as divided by a programmable divide-by-CDIV clock divider 14 to produce the oversampling clock signal CKOS. Oversampling clock signal CKOS is provided as an input to and is used by analog sigma-delta modulator 716, digital sigma-delta modulator 18, decimation filter 720, interpolation filter 84, and analog demodulator 22. In a preferred embodiment, the sigma-delta modulators are second order. Oversampling clock signal CKOS is also coupled as the input of programmable divide-by-M1 counter 24 and programmable divide-by-L1 counter 74. M1 is the decimation factor of decimation filter 720. The output of divide-by-M1 counter 24 provides to decimation filter 720 a second clock signal, decimation clock signal CKM, that has a frequency equal to that of the oversampling clock signal CKOS divided by the decimation factor M1. The upstream portion of decimation filter 720 operates at the rate of clock CKOS. The downstream portion operates at the lower, decimated rate of clock CKM. In a illustrative embodiment, decimation filter 720 is a third-order comb filter.

The analog input signal to the A/D conversion signal path 90 provides one input directly to multiplexer 8. The analog input signal multiplied by a programmable gain G1 in multiplier 12 is provided as the other input to multiplexer 8. Multiplexer 8 is responsive to select input 40 to selectively provide one of its analog inputs as its analog output signal.

The analog output signal provided by multiplexer 8 is received by analog sigma-delta modulator 716 as its input. The analog sigma-delta modulator, which may receive dither from dither generator 26, converts the scaled analog input signal into a 1-bit-per-sample first digital data stream. As is known in the art, the 1-bit bit-per-sample first digital data stream generated by a sigma-delta modulator is converted from a signal represented by zeroes and ones (unsigned data format) to a two-bit-per-sample signal represented by minus ones and plus ones which are consistent with two's complements or sign-magnitude format. Such a representation has a midpoint represented by zero, can take the form of a two's-complement word, and has a sign associated with each value. The output of analog sigma-delta modulator 716 provides an input to multiplexer 28. Multiplexer 28 is responsive to user-determined select input 30 to selectively provide one of its inputs at its output. The output of multiplexer 28 is coupled as the input to decimation filter 720.

Decimation filter 720 filters and decimates the 1-bit-per-sample first digital data stream into a 20-bit-per-sample second digital data stream at the frequency of clock CKM1. The filtering removes out of band energy. In the illustrative embodiment, decimation filter 720 is a third-order comb filter.

Barrel shift selector 34 receives the second digital data stream from the output of decimation filter 720, up to 20 bits per sample, and produces as an output a third digital data stream having 17 bits per sample. The barrel shift selector 34 is programmable and can be varied to select one of four possible bit fields: bits 0–16, 1–17, 2–18, or 3–19.

The 17-bit-per-sample third digital data stream output from barrel shift selector 34 provides the input to saturation circuit 36 through multiplexer 38. The output from barrel shift selector 34 is provided directly as one input to multiplexer 38. The output from barrel shift selector 34 is multiplied by the gain 1/G1 in multiplier 42 as the other input to multiplexer 38. Dither from generator 26 may be added to the gain scaling. Multiplexer 38 is responsive to select input 40 to selectively provide one of its inputs at its output.

Multiplexers 8 and 38 are both responsive to select input 40 such that when the input to multiplexer 8 that is multiplied by gain G1 is selected, the input to multiplexer 38 that is multiplied by gain 1/G1 is selected. Gain scaling employing gain G1 and 1/G1 result in a pulse code modulated output from multiplexer 38 that is full scale, 0dB reference, when the analog input signal to analog sigma-delta modulator 716 is less than full scale. Gain G1 is selected to maintain unity gain. In the manner, the absolute gain of the analog-to-digital signal path (from multiplexer 8 input to multiplexer 38 output) is the same whether gain scaling is employed or not.

Saturation circuit 36 takes the 17-bit-per-sample fourth digital data stream output from multiplexer 38 and reduces each data sample to a 16 bit sample. The output of saturation circuit 36 is a 16-bit-per-sample fifth digital data stream.

The 16-bit-per-sample fifth digital data stream output from saturation circuit 36 is loaded into a first-in-first-out (FIFO) register 44. Register 44 stores several such samples of data. From FIFO 44, the 16 bit samples are temporarily transferred to register 46 prior to being written to random access memory (RAM) 48. RAM 48 is part of digital signal (DSP) processor 50. A DSP is a special purpose microprocessor developed to efficiently perform mathematical operations on realtime digital data. The samples are transferred by way of the internal data bus 52 as controlled by depth flag 54, status flag 55 and interrupt flag 56.

The digital-to-analog conversion signal path converts digital data from RAM 48 of DSP 50 into analog form at the output of analog demodulator 22. Digital data from RAM 48 of DSP 50 for conversion to analog form is written as a 16-bit sample temporarily to register 58. Each 16 bit sample is then transferred to FIFO 64 as controlled by depth flag 60, status flag 61, and interrupt flag 62. The output from FIFO 64 is a 16-bit-per-sample sixth digital data stream. The sixth digital data stream is input to interpolation filter 78 through multiplexer 68. The sixth digital data stream output from FIFO 64 is provided directly as one of the inputs to multiplexer 68. The sixth digital data stream is multiplied by the inverse of gain G2 in multiplier 72 as the other input to multiplexer 68. Multiplexer 68 is responsive to a select input 70 to selectively provide one of its inputs as its output. The output of multiplexer 68 is a seventh digital data stream.

The seventh digital data stream is provided as the input to interpolation filter 78. Interpolation filter 78 receives clocks CKL1 and CKL2. Clock CKL1 is clock CKOS divided by interpolation factor L1. Clock CLK2 is clock CLK1 divided by interpolation factor L2. The output from interpolation filter 78 is a 27-bit-per-sample eighth digital data stream. Interpolation filter 78, in a illustrative embodiment, is a third-order comb filter that removes out-of-band energy and produces the eighth digital data stream at a frequency of the over sampling frequency as divided by L1. The upstream portion of interpolation filter 78 operates at the lower clock rate CLK2. The downstream portion operates at the higher clock rate CLK1.

The eighth digital data stream provides the input to barrel shift selector 80. Barrel shift selector 80 receives the 27-bit-per-sample eighth digital data stream from the output of interpolation filter 78 and selects a field of 17 bits per sample to provide as its output, a ninth digital data stream. The field of barrel shift selector 80 is programmable. In the exemplary embodiment there are eleven possible seventeen bit fields. In a illustrative embodiment, the field of barrel shift selector 80 is programmed to select one of the top seven bit fields: 4–20; 5–21; 6–22; 7–23 through 10–26.

Saturation circuit 82 receives the 17-bit-per-sample ninth digital data stream output from barrel shift selector 80 and reduces each sample to 16 bits to provide a tenth digital data stream substantially in the same manner as saturation circuit 36.

Interpolation filter 84 receives the tenth digital data stream and operates at the oversampling clock rate, as divided by programmable divide by L1. The upstream portion of interpolation filter 84 operates at the lower clock rate CKL1. The downstream portion operates at the higher clock rate CKOS. Interpolation filter 84, in a illustrative embodiment is a first-order comb filter that removes out of band energy and produces an eleventh digital data stream as an output.

The eleventh digital data stream output of interpolation filter 84 is coupled as the input to digital sigma-delta modulator 18. Digital sigma-delta modulator 18 in a illustrative embodiment is second order. Modulator 18 may receive dither from dither generator 26 and converts the 16-bit-per-sample data into a 1-bit-per-sample twelfth digital data stream.

The output of digital sigma delta modulator 18 provides an input to multiplexer 86. Multiplexer 86 is responsive to select input 88 to selectively provide one of the inputs at its output. The multiplexer output is a 1-bit-per-sample thirteenth digital data stream.

Analog demodulator 22 is a 1-bit sample and hold converter which converts the 1-bit-per-sample thirteenth digital data stream received from multiplexer 86 into a step wise continuous analog output signal. Analog demodulator 22 includes one or more analog filters as known in the an to smooth the analog output signal. The analog output signal from analog demodulator 22 is provided directly as one of the inputs to multiplexer 96 and is multiplied by gain G2 in multiplier 94 to provide the other input to multiplexer 96. Gain G2 may be achieved in any known manner. Multiplexer 96 is responsive to select input 70 to selectively provide one of its inputs as its output. The output of multiplexer 96 is an analog signal. Multiplexers 68 and 96 are both responsive to select input 70 such that when the input to multiplexer 68 that is multiplied by gain 1/G2 is selected, the input to multiplexer 96 that is multiplied by gain G2 is selected. Gain G2 is selected to maintain unity gain. In this manner, the absolute gain of the digital-to-analog signal path (from multiplexer 68 input to multiplexer 96 output) is the same whether or not gain scaling is employed.

To reduce the number of interrupts incurred by the DSP, a register is provided to temporarily store the digital data stream samples available to the DSP. Data could a synchronously ripple through the register or could be synchronously clocked through the register. In a preferred embodiment, the register is a synchronous first-in-first-out register 44. In a FIFO, digital data is loaded in sequence and unloaded in the same sequence. The decimated digital data stream output from decimator 20 passes through barrel shift selector 34 and saturation block 36 resulting in a 16-bits-per-sample digital data stream. Each 16-bit-per-sample word is stored in the next available register in FIFO 44. By way of example, a typical FIFO would have a number of registers such as 8 registers, each storing a 16-bit word. A programmable FIFO depth pointer 54 is user set to a pre-selected number of registers, typically less than the full depth of the FIFO, to define when the FIFO is "full" for purposes of interrupting the DSP. Depth pointer 54 of FIFO 44 is programmable to any integer from one to the full depth of the FIFO. FIFO status flag 55 indicates the instantaneous number of samples stored in FIFO 44. When the number of registers indicated by the depth flag is full, the interrupt flag 56 transitions to interrupt the DSP. The DSP goes into the interrupt service routine and upon servicing the FIFO 44 interrupt, each word stored in FIFO 44 is transferred from its location in FIFO 44 temporarily to register 46 prior to being transferred to DSP 50 RAM 48. When the depth flag is set to a value less than the total depth of FIFO 44, all of the digital data samples stored in FIFO 44 do not have to be transferred to DSP RAM prior to receipt of the next digital data sample from the saturation circuit, thereby providing flexibility in the timing of servicing the interrupt. The registers represented by the difference between the capacity of FIFO 44 and the depth flag setting are available for use to cushion the timing of the interruption of the DSP. When all of the registers of FIFO 44 are full, the DSP must assure that data is transferred from the FIFO to DSP RAM prior to the FIFO receiving the next digital data sample from saturation block 36, or an overflow condition will result upon receiving the next data.

Figure 2:
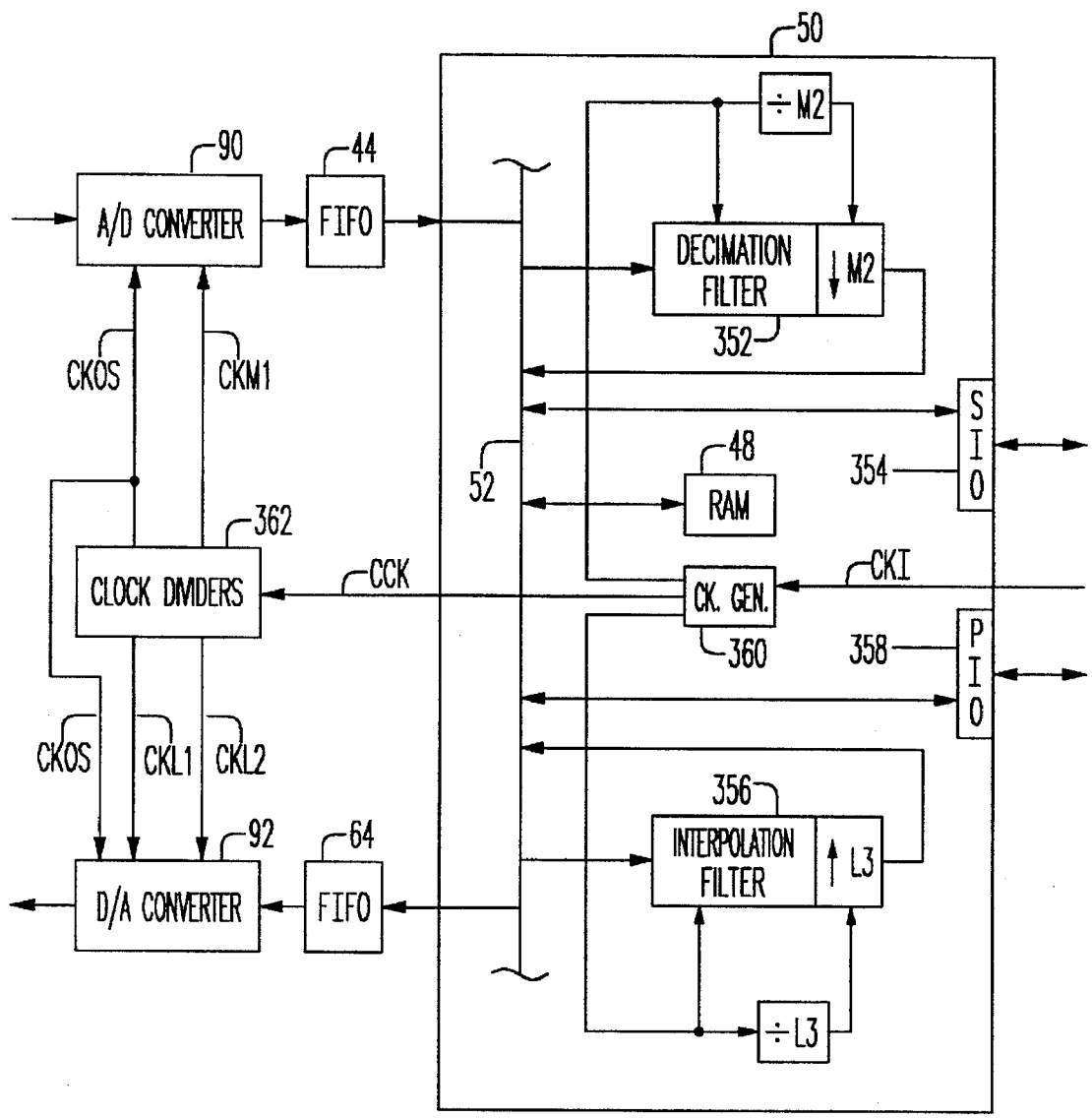
FIG. 2 is a block diagram of a portion of the data converter of FIG. 1.

Sampling rate conversion can also be implemented within DSP 50 in another stage of decimation, as shown in FIG. 2. The digital data samples transferred to DSP 50 are lowpass filtered then decimated by a decimation factor of M2 in decimation filter 352. Whereas the data processed by the hardware decimator is typically processed synchronously, the data processed by the decimator within DSP 50 can be achieved either synchronously or in bursts. For the decimation within DSP 50, a clock signal appropriate for the mode of operation of decimation filter 352 is generated by clock generator 360. A second clock signal is derived therefrom by dividing the clock signal by decimation factor, M2.

The oversampling ratio is the product of the decimation factors of all of the stages of decimation. The two stages of decimation here result in a total oversampling ratio of M1×M2. For each M2 digital data samples received from FIFO 44, one decimated digital data sample is produced by decimation filter 352. Typically, depth pointer 54 would be set to a value that is equal to, a submultiple or a supermultiple of decimation ratio M2. For example, if M2 was 4, the depth pointer could be set to 1, 2, 4, 8, 12, ... up to the depth of the FIFO. During a single interrupt, the DSP would read the digital data samples available for transfer to RAM, then jump out of the interrupt service routine. When the depth pointer is greater than one, the number of interrupts experienced by the DSP to receive digital data samples is reduced as compared to interrupting the DSP each time digital data samples become available. Setting the depth pointer to 4 reduces to ¼ the number of interrupts to transfer the same quantity of digital data samples when compared to transferring one sample of digital data per interrupt. Upon each interrupt, the DSP would typically transfer the number of digital data samples set by the depth pointer, in this example, 4. When the FIFO depth pointer is set lower than the magnitude of decimation factor M2, more than one interrupt will be required to provide M2 data samples to decimation filter 352 to perform the decimation function in DSP 50. Correspondingly, when the depth pointer is greater than M2, more than M2 digital data samples are transferred during each interrupt. Multiple decimation operations may be performed by DSP 50 between some or all of the interrupts. If the FIFO depth pointer is less than the total depth of the FIFO, additional samples can be written into the FIFO before it overflows, hence, the DSP does not have to service the interrupt to the interrupt without loss of data.

Once the digital data has been decimated by DSP 50, the decimated digital data samples may be further processed by DSP 50 or stored in RAM 48. Alternatively, the decimated digital data could be provided to serial or parallel input/output port 354 to be taken off of the DSP chip.

Absent the FIFO, the DSP would take one digital data sample, or word, at a time until the minimum number of words for processing had been transferred to the DSP. Employing FIFO 44 enables the number of words selected to be transferred upon the occurrence of each interrupt to be selected as at least the minimum number for DSP processing, or a multiple of the minimum number.

The number of interrupts is also reduced in the D/A path. To reduce the number of interrupts incurred by the DSP, a register is provided to temporarily store the digital data stream samples being received from the DSP. In a preferred embodiment, the register is a synchronous first-in-first-out data register (FIFO) 64. The digital data stream received from DSP 50 is temporarily stored in register 58 before being transferred to FIFO 64. Each 16-bit-per-word digital data sample is stored in the next available register in FIFO 64. A programmable FIFO depth pointer 60 is set to a pre-selected number of registers, typically zero. The FIFO depth pointer 60 defines the minimum number of registers holding data when the FIFO is considered "empty" for purposes of interrupting the DSP. When the depth pointer 60 is set to more than this minimum depth of the FIFO, a buffer is built-in, such that there may be additional digital data samples available in FIFO 64 even when the FIFO depth pointer 60 indicates the FIFO is empty. The number of registers represented by the depth pointer setting are available to cushion interruption of the DSP. When all of the registers of FIFO 64 are empty, the DSP must assure data is transferred from the DSP RAM to FIFO 64 prior to interpolation filter 78 requiring the next digital data sample. FIFO status flag 61 indicates the instantaneous number of samples stored in FIFO 64. When the number of registers indicated by the depth flag are empty, interrupt flag 62 transitions to interrupt the DSP. An underflow condition will occur when the FIFO is empty and decoder 92 attempts to read the next sample.

Sampling rate conversion can also be implemented within DSP 50 in another stage of interpolation. Digital data samples acquired from RAM 48, generated within DSP 50, or received through serial input port 354 or parallel input port 358 are interpolated by interpolation filter 356. Interpolation filter 356 interpolates the digital data samples it receives by an interpolation factor L3 and low pass filters the interpolated samples. Whereas the hardware interpolation described above with respect to interpolation filters 78 and 84 is typically conducted in real time, the interpolation within DSP 50 can be achieved either synchronously or in bursts. For the interpolation within DSP 50, a clock signal appropriate for the mode of operation of interpolation filter 356 is generated by clock generator 360. A second clock signal is derived therefrom by dividing the clock signal by the interpolation factor, L3.

Interpolation filter 356 interpolates the digital data samples at a rate $F_s$, producing L3 samples for each digital data sample received. By way of example, the depth pointer could be set to zero, indicating that FIFO 64 is empty when the FIFO empty flag reaches zero. A DSP interrupt is then generated, and the DSP writes L3 data samples to the FIFO. The next interrupt would occur when oversampling decoder 92 reads all L3 samples, and the FIFO empty pointer again reaches zero. In this example, the number of interrupts is reduced by a factor of L3 as a result. In another example, if L3 is larger than the maximum depth of the FIFO, a submultiple of L3 number of data samples, such as (L3)/2, can be written to the FIFO at the time of the interrupt. In yet another example, a number of data samples that is a supermultiple of L3, such as 2(L3), can be written to the FIFO at the time of the interrupt. In any of these examples, the FIFO depth pointer could alternatively be set to a value of one or more, rather than zero, which allows a cushion of time before the DSP must service the interrupt. If the FIFO pointer is set to (L3)–1, this cushion time interval consists of one complete set of interpolated data samples from the DSP. This can be useful in applications where system-level interrupts of the DSP occur at submultiples of the baseband data rate going into interpolation filter 356. Such an example can occur in a modem, where the symbol rate is typically at least a factor of two less than the baseband data rate.

The invention is particularly useful in communication systems and equipment employing integrated circuits wherein this function could be fabricated in a single chip signal processor. Such communication systems and equipment have the advantage of interrupting a digital signal processor fewer times in processing a give quantity of data, thereby conserving power by eliminating needless execution of the interrupt service routine instructions.

While the illustrative embodiment has been described as including oversampling converters with decimation or interpolation filtering, the invention is also applicable to non-oversampling converters. Other applications include speech coding as well as audio and video transform coding where digital processor must acquire large blocks of data before further processing the entire block of data.

The invention is not limited to the numerical values used to disclose the illustrative embodiment. The bit-width output from various elements, the order of the various filters, the ranges for the interpolation and decimation factors and the output fields and ranges for the barrel shift selector and the number of bits of saturation, and the like, are exemplary in the illustrated embodiment.

While the illustrative embodiment of the invention has not been described as incorporating pipelining or paralleling to reduce latency times, one skilled in the art would recognize the enhanced computational efficiency available by utilizing such techniques.

We claim:

1. Apparatus for converting a signal from one form to another, comprising:
    a converter for converting a signal having a first form to a signal having a second form, one of said forms being analog and the other of said forms being digital;
    a storage register for receiving and temporarily storing digital data samples, the digital data samples transferable out of the storage register in the same sequence as the digital data samples were received;
    a digital processor coupled to the storage register, the digital processor adapted to provide a sampling rate conversion, the digital processor interruptible to transfer digital data samples either to or from the storage register; and
    a depth flag, the depth flag set to a preselected depth value, a digital processor interrupt being generated upon the number of digital data samples stored in the storage register equaling the pre-selected depth flag value, whereby the number of digital processor interrupts to transfer a given number of digital data samples is reduced.

2. Apparatus as recited in claim 1, wherein the storage register is a first-in-first-out register.

3. Apparatus as recited in claim 2, wherein the first-in-first-out register is synchronous.

4. Apparatus as recited in claim 1, wherein the converter is an oversampling converter.

5. Apparatus as recited in claim 4, wherein the converter is a sigma-delta converter.

6. Apparatus as recited in claim 1, wherein the storage register further comprises an interrupt flag.

7. Apparatus as recited in claim 1, wherein the storage register further comprises a status flag, the status flag indicating the number of register locations containing data.

8. Apparatus as recited in claim 1, wherein the sampling rate conversion is decimation.

9. Apparatus as recited in claim 1, wherein the sampling rate conversion defines a factor, the factor being a submultiple of the depth flag.

10. Apparatus as recited in claim 1, wherein the sampling rate conversion defines a factor, the factor being a super-multiple of the depth flag.

11. Apparatus for converting a signal from one form to another, comprising:
    a converter for converting an analog signal to a series of digital data samples;
    storage means for receiving the series of digital data samples from the converter and for storing the samples, the storage means receiving the series of digital data samples one data sample at a time as the data sample is produced by the converter, the storage means for temporarily storing the data samples in a sequence in which it was received;
    a digital signal processor adapted to provide a sampling rate conversion, the digital signal processor for removing the stored data samples from the storage means in the sequence in which the data samples were received, the digital signal processor removing multiple data samples upon each interrupt; and a depth flag, the depth flag set to a preselected value, a digital signal processor interrupt being generated upon the number of data samples stored in the storage means equaling the pre-selected depth flag value, whereby the number of digital signal processor interrupts to transfer a given number of data samples is reduced.

12. Apparatus as recited in claim 11, wherein the storage means is a first-in-first-out register.

13. Apparatus as recited in claim 11, wherein the first-in-first-out register is synchronous.

14. Apparatus as recited in claim 11, wherein the converter is an oversampling converter.

15. Apparatus as recited in claim 14, wherein the oversampling converter is a sigma-delta converter.

16. Apparatus as recited in claim 11, wherein the sampling rate conversion is interpolation.

17. Apparatus as recited in claim 11, where the sampling rate conversion defines a factor, the factor being a submultiple of the depth flag.

18. Apparatus as recited in claim 11, wherein the sampling rate conversion defines a factor, the factor being a supermultiple of the depth flag.

19. Apparatus for converting a signal from one form to another, comprising:

a digital signal processor adapted to provide a sampling rate conversion, the digital signal processor for providing a sequence of digital data samples, the digital signal processor providing multiple digital data samples upon each interrupt;

a storage means for receiving the digital data samples from the digital signal processor, the storage means for temporarily storing the digital data samples in the sequence in which they were received and for providing as an output the digital data samples one sample at a time;

a converter for receiving the digital data samples output from the storage means and for converting the digital data samples to an analog signal; and a depth flag, the depth flag set to a preselected value, a digital signal processor interrupt being generated upon the number of digital data samples stored in the storage means equaling the pre-selected depth flag value, whereby the number of digital signal processor interrupts to transfer a given number of digital data samples is reduced.

20. Apparatus as recited in claim 10, wherein the storage means is a first-in-first-out register.

21. Apparatus as recited in claim 20, wherein the first-in-first-out register is synchronous.

22. Apparatus as recited in claim 10, wherein the converter is an oversampling converter.

23. Apparatus as recited in claim 22, wherein the oversampling converter is a sigma-delta converter.

24. Apparatus as recited in claim 10, wherein the sampling rate conversion defines a factor, the factor being a submultiple of the depth flag.

25. Apparatus as recited in claim 10, wherein the sampling rate conversion defines a factor, the factor being a supermultiple of the depth flag.

26. Apparatus, comprising:

an analog-to-digital converter for converting an analog signal to a first digital data stream;

a sampling rate converter for receiving the first digital data stream and for providing a first stage of sampling rate conversion, and for generating a second digital data stream;

a first storage means for receiving the second digital data stream from the sampling rate converter, the first storage means for receiving the digital data stream one sample at a time as the digital data is produced by the sampling rate converter, the first storage means for temporarily storing the digital data in the sequence in which it was received;

a digital processor, the digital processor for removing the digital data from the first storage means in the sequence in which it was stored, the digital processor removing multiple samples upon each read interrupt, the digital processor for operating on the digital data acquired from the first storage means to provide a second stage of sampling rate conversion, the digital processor providing multiple ones of a third digital data stream upon a write interrupt;

a second storage means for receiving the third digital data stream from the digital processor, the second storage means for temporarily storing the digital data samples of the third digital data stream in the sequence in which they are received and for providing as an output the digital data samples of the third digital data stream one sample at a time; and a digital-to-analog converter for converting the digital data samples of the third digital data stream into an analog signal.

27. A method for converting a signal from one form to another, comprising the steps of:

converting a signal having a first form to a signal having a second form, one of said forms being analog and the other of said forms being digital;

providing a sampling rate conversion of the digital form of the signal from a first sample rate to a second sample rate in a first stage of sample rate conversion;

receiving and temporarily storing digital data samples, the digital data samples transferable out of a receiving and storing means in the same sequence as the digital data samples were received;

periodically interrupting a digital processor to transfer digital data samples either to or from the temporary storage, whereby the number of interrupts of the digital processor is reduced when multiple digital data samples are transferred during each interrupt as compared to transferring a single digital data sample per interrupt; and performing a second stage of sampling rate conversion on the digital data samples in the digital processor.

* * * * *